United States Patent
Pavol

(10) Patent No.: US 8,187,386 B2
(45) Date of Patent: May 29, 2012

(54) TEMPORALLY VARIABLE DEPOSITION RATE OF CDTE IN APPARATUS AND PROCESS FOR CONTINUOUS DEPOSITION

(75) Inventor: Mark Jeffrey Pavol, Arvada, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 0 days.

(21) Appl. No.: 12/975,435

(22) Filed: Dec. 22, 2010

(65) Prior Publication Data

US 2012/0027922 A1 Feb. 2, 2012

(51) Int. Cl.
*C23C 16/00* (2006.01)
*H01L 21/306* (2006.01)
*C23F 1/00* (2006.01)

(52) U.S. Cl. ..... 118/718; 118/719; 118/729; 156/345.34

(58) Field of Classification Search ............. 118/718, 118/719, 729, 117, 118, 122, 123; 156/345.34
See application file for complete search history.

(56) References Cited

U.S. PATENT DOCUMENTS

| | | |
|---|---|---|
| 5,147,498 A | 9/1992 | Nashimoto |
| 5,248,349 A | 9/1993 | Foote et al. |
| 5,288,515 A | 2/1994 | Nakamura et al. |
| 5,304,499 A | 4/1994 | Bonnet et al. |
| 5,334,251 A | 8/1994 | Nashimoto |
| 5,366,764 A | 11/1994 | Sunthankar |
| 5,994,642 A | 11/1999 | Higuchi et al. |
| 6,171,641 B1 | 1/2001 | Okamoto et al. |
| 6,423,565 B1 | 7/2002 | Barth et al. |
| 6,440,494 B1 * | 8/2002 | Arena-Foster ............... 427/250 |
| 6,444,043 B1 | 9/2002 | Gegenwart et al. |
| 6,719,848 B2 | 4/2004 | Faykosh et al. |
| 7,194,197 B1 | 3/2007 | Wendt et al. |
| 7,220,321 B2 | 5/2007 | Barth |
| 2002/0088542 A1 * | 7/2002 | Nishikawa et al. ...... 156/345.29 |
| 2002/0117199 A1 | 8/2002 | Oswald |
| 2003/0044539 A1 | 3/2003 | Oswald |
| 2006/0219177 A1 * | 10/2006 | Brcka ............................ 118/726 |
| 2009/0194165 A1 | 8/2009 | Murphy et al. |

FOREIGN PATENT DOCUMENTS

EP 0853345 A1 7/1998

* cited by examiner

*Primary Examiner* — Keath Chen
(74) *Attorney, Agent, or Firm* — Dority & Manning, P.A.

(57) ABSTRACT

Apparatus is generally provided for vapor deposition of a sublimated source material as a thin film on a photovoltaic module substrate. The apparatus includes a distribution plate disposed below the distribution manifold and at a defined distance above a horizontal conveyance plane of an upper surface of a substrate conveyed through the apparatus. The distribution plate defines a pattern of passages therethrough configured to provide greater resistance to the flow of sublimated source vapors at a first longitudinal end than a second longitudinal end. A process for vapor deposition of a sublimated source material to form thin film on a photovoltaic module substrate is also provided via distributing the sublimated source material onto an upper surface of the substrates through a distribution plate positioned between the upper surface of the substrate and the receptacle.

15 Claims, 10 Drawing Sheets

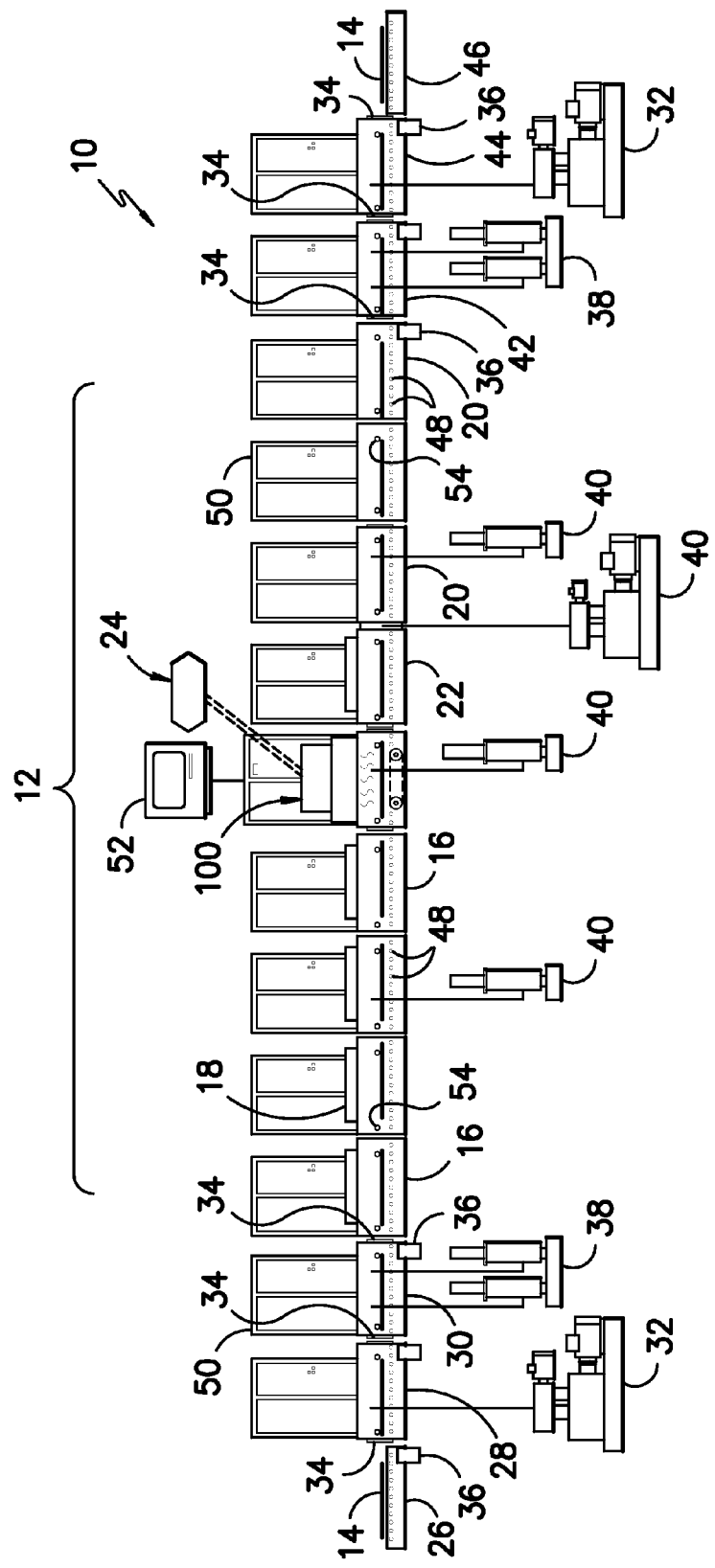
FIG. -1-

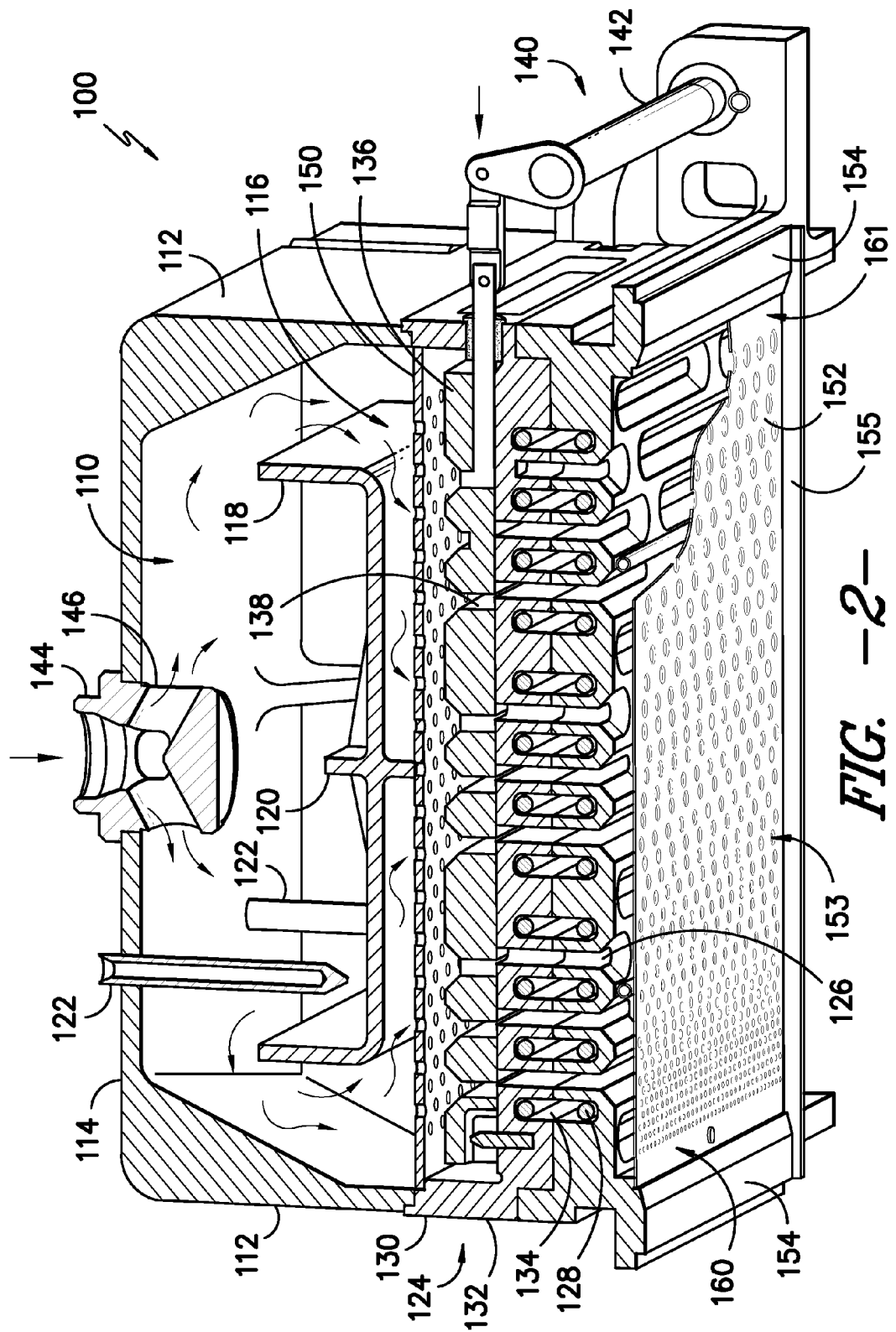
FIG. -2-

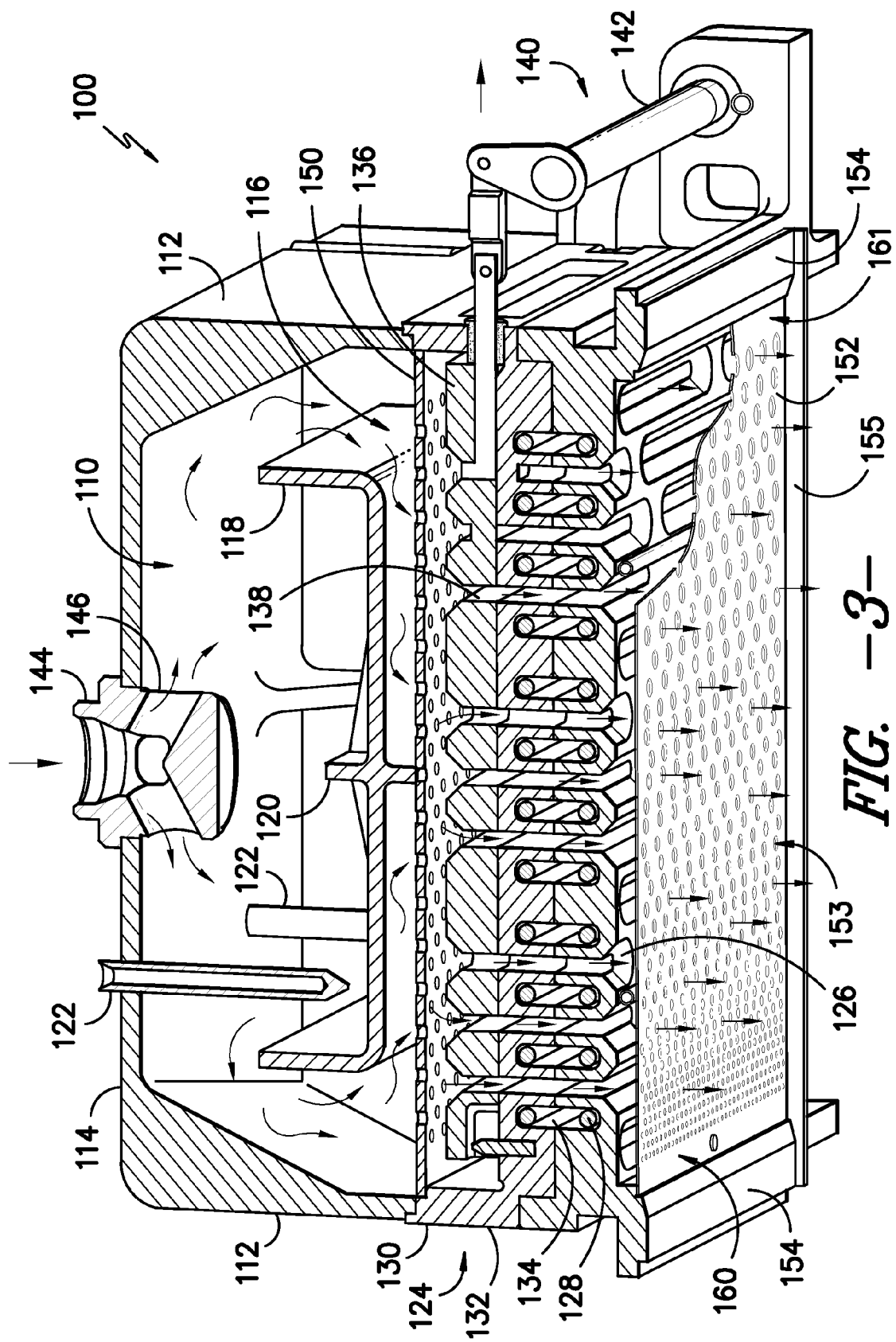
FIG. -3-

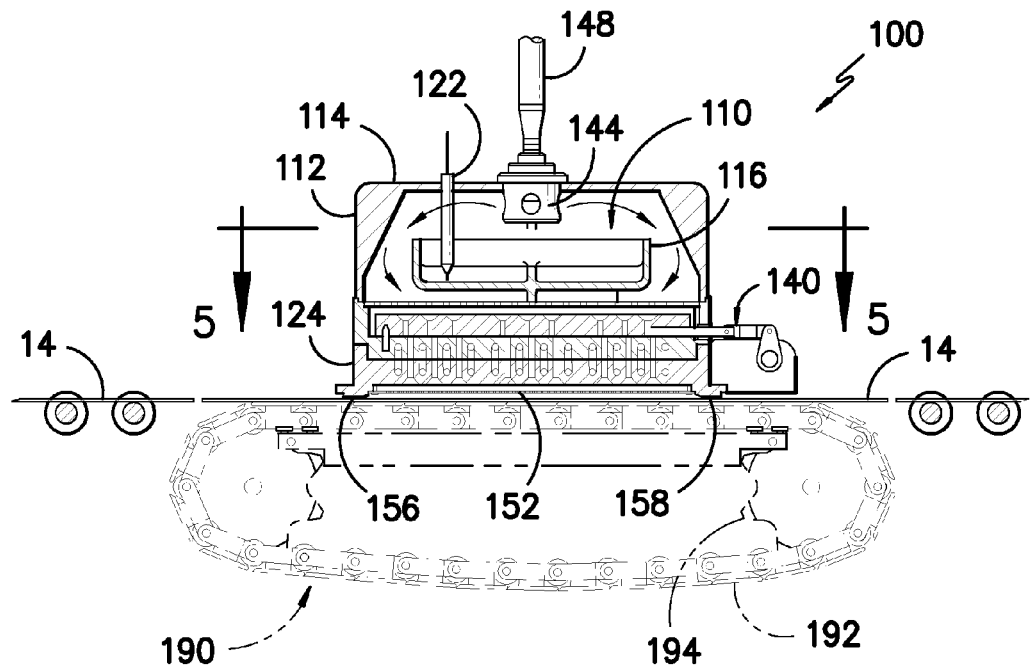
FIG. -4-
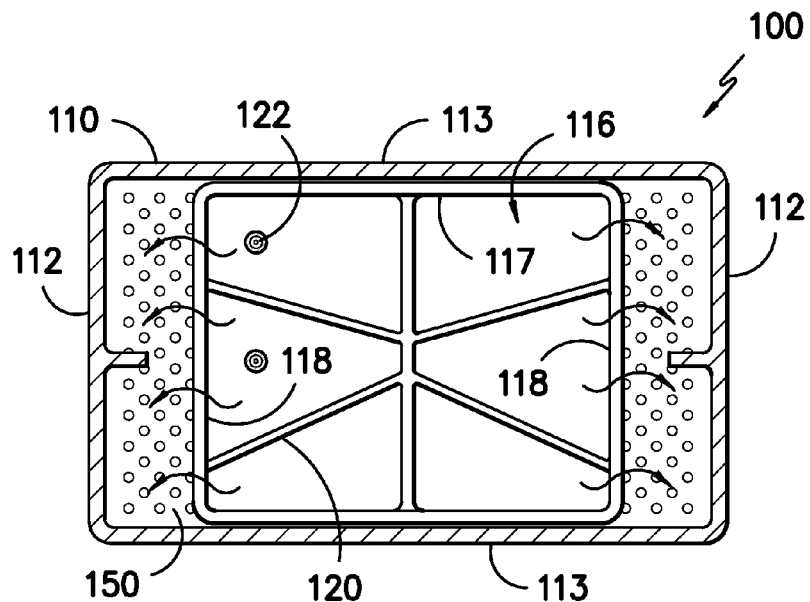
FIG. -5-

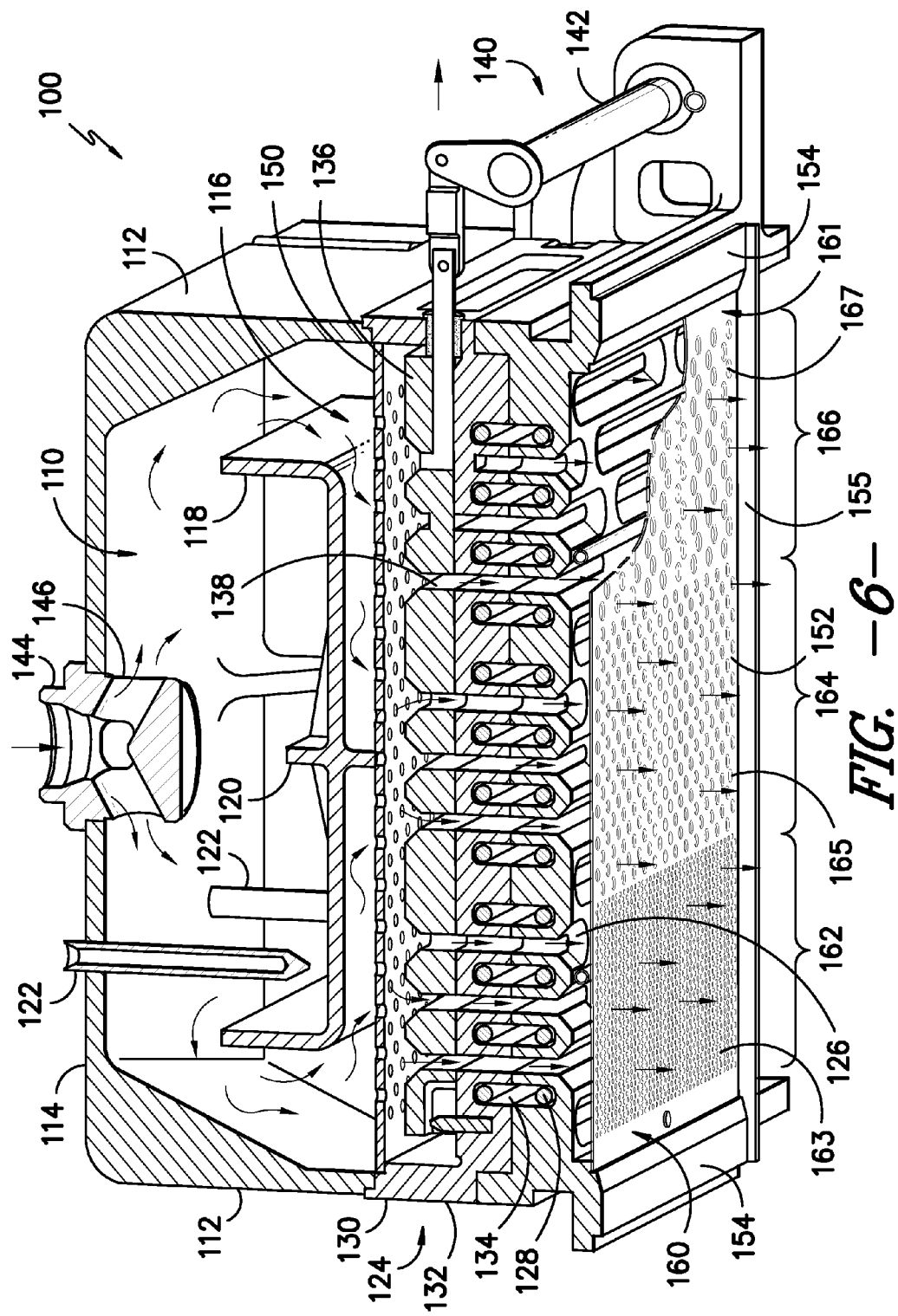

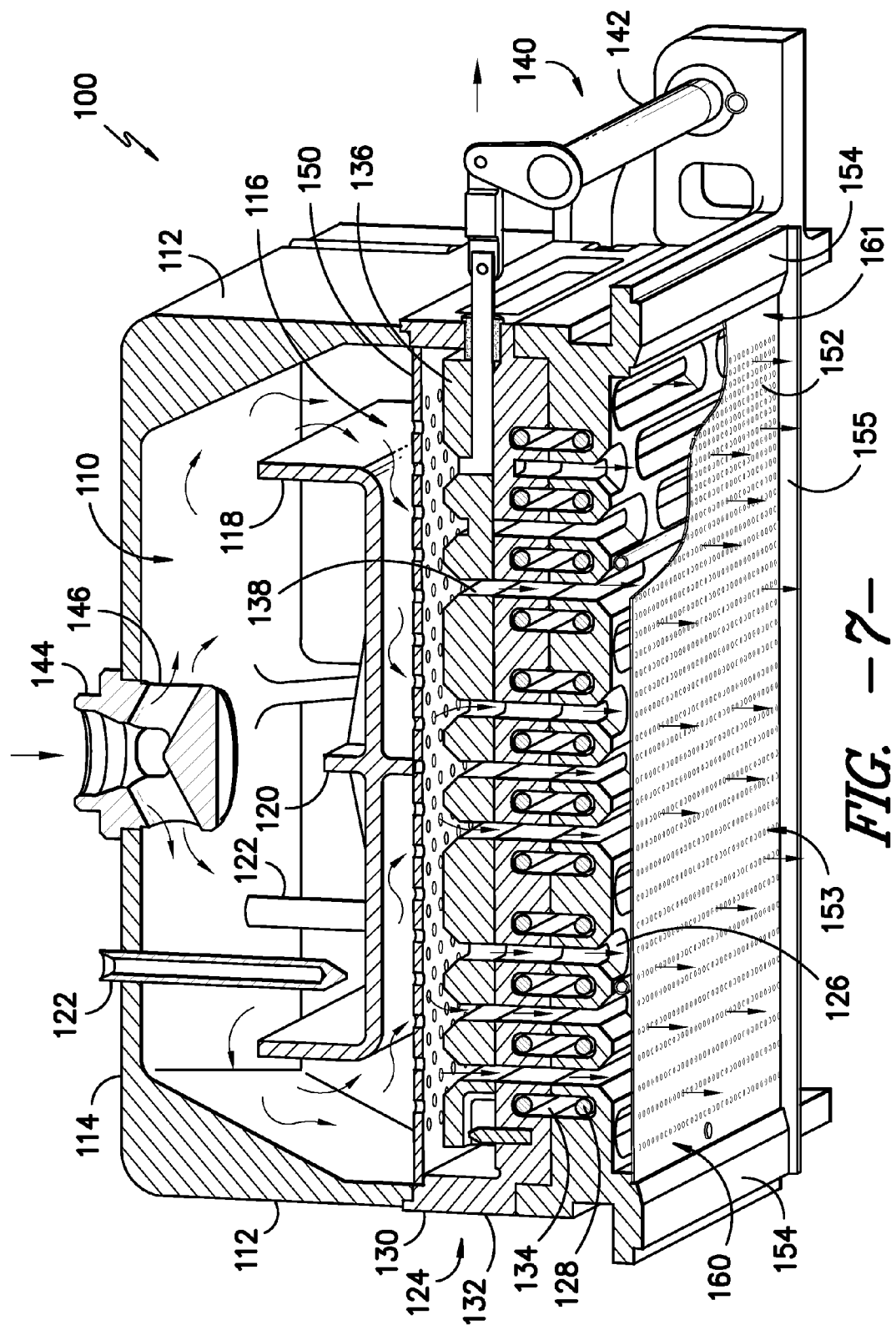
FIG. -7-

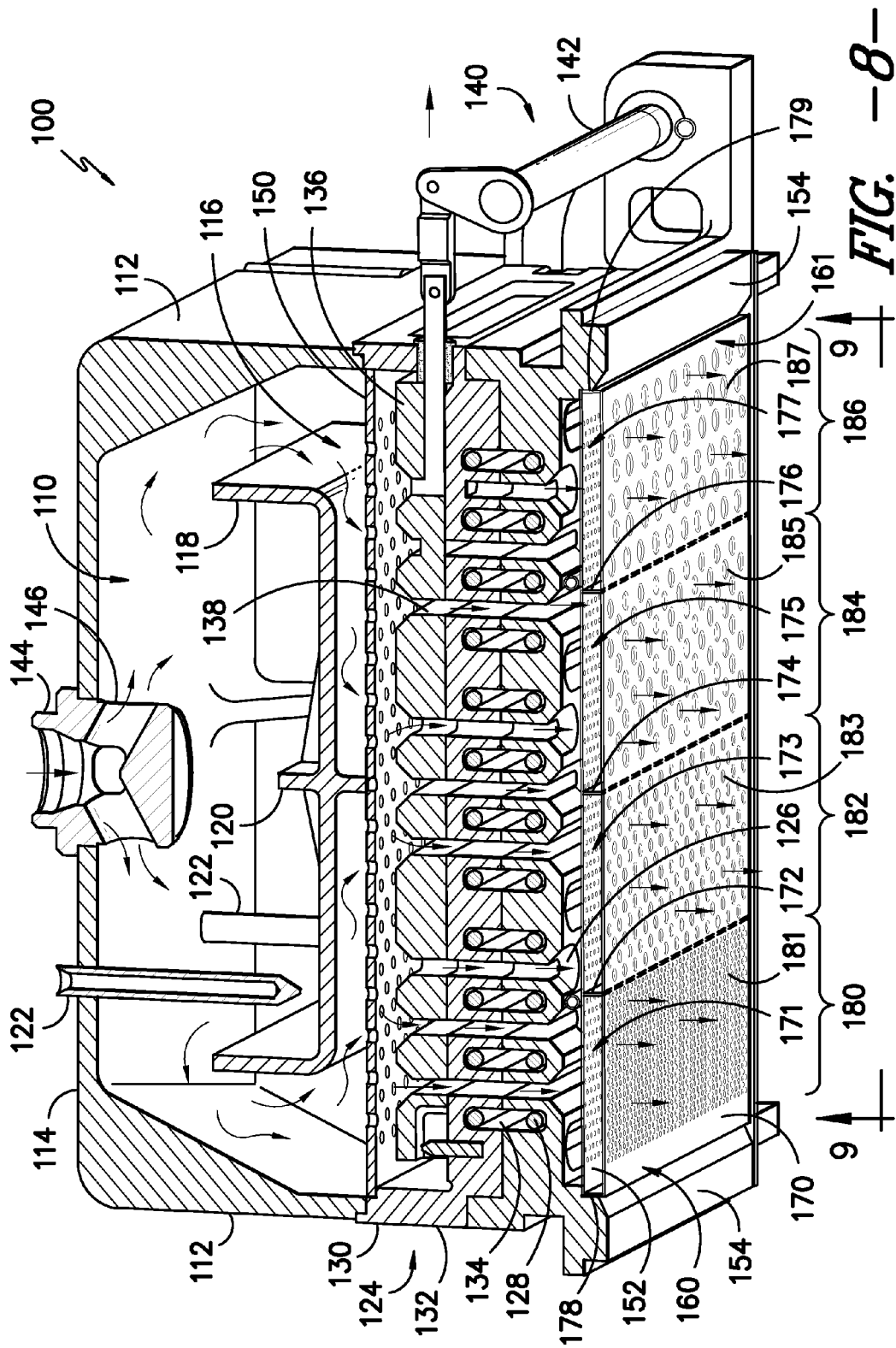

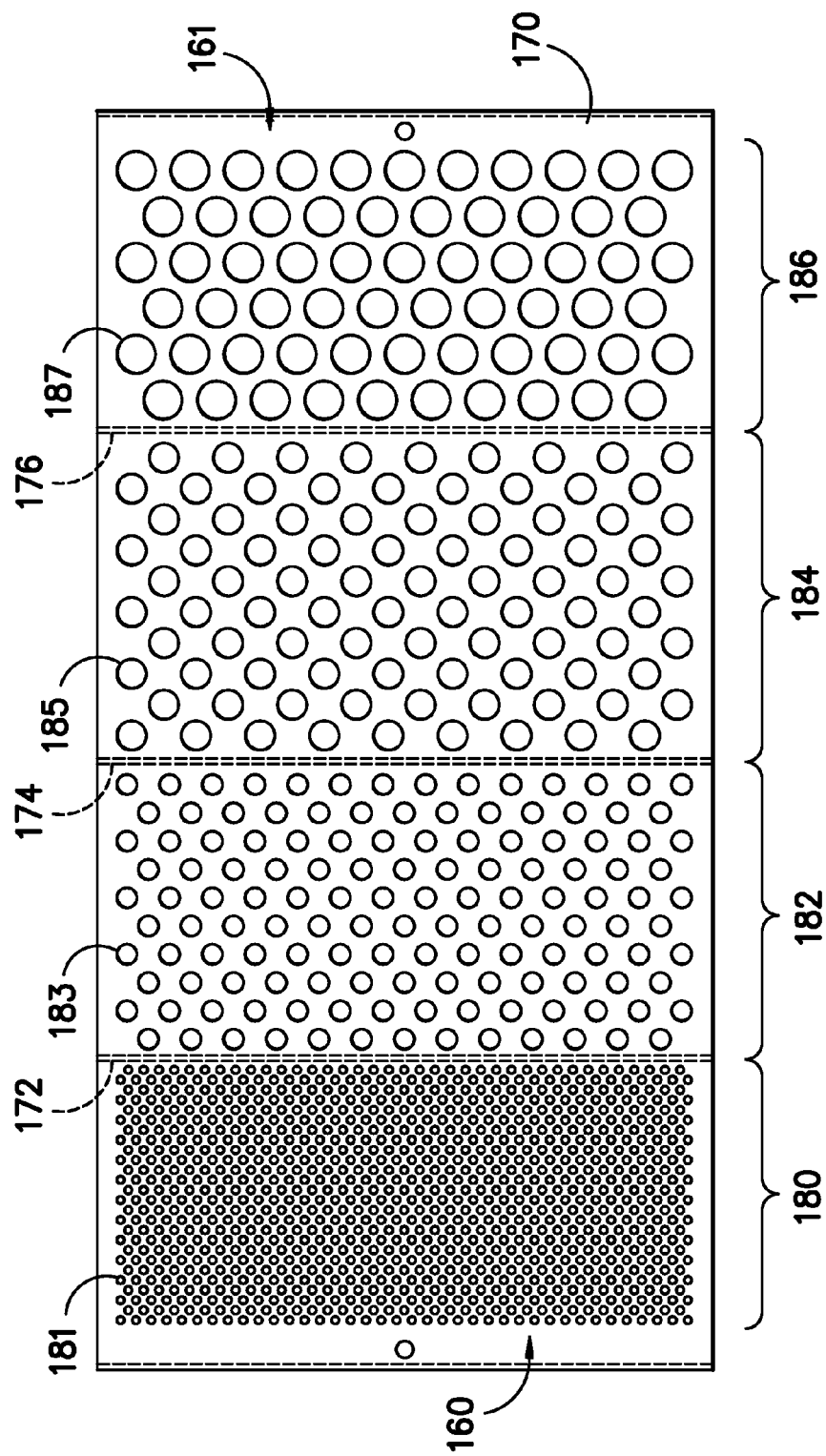

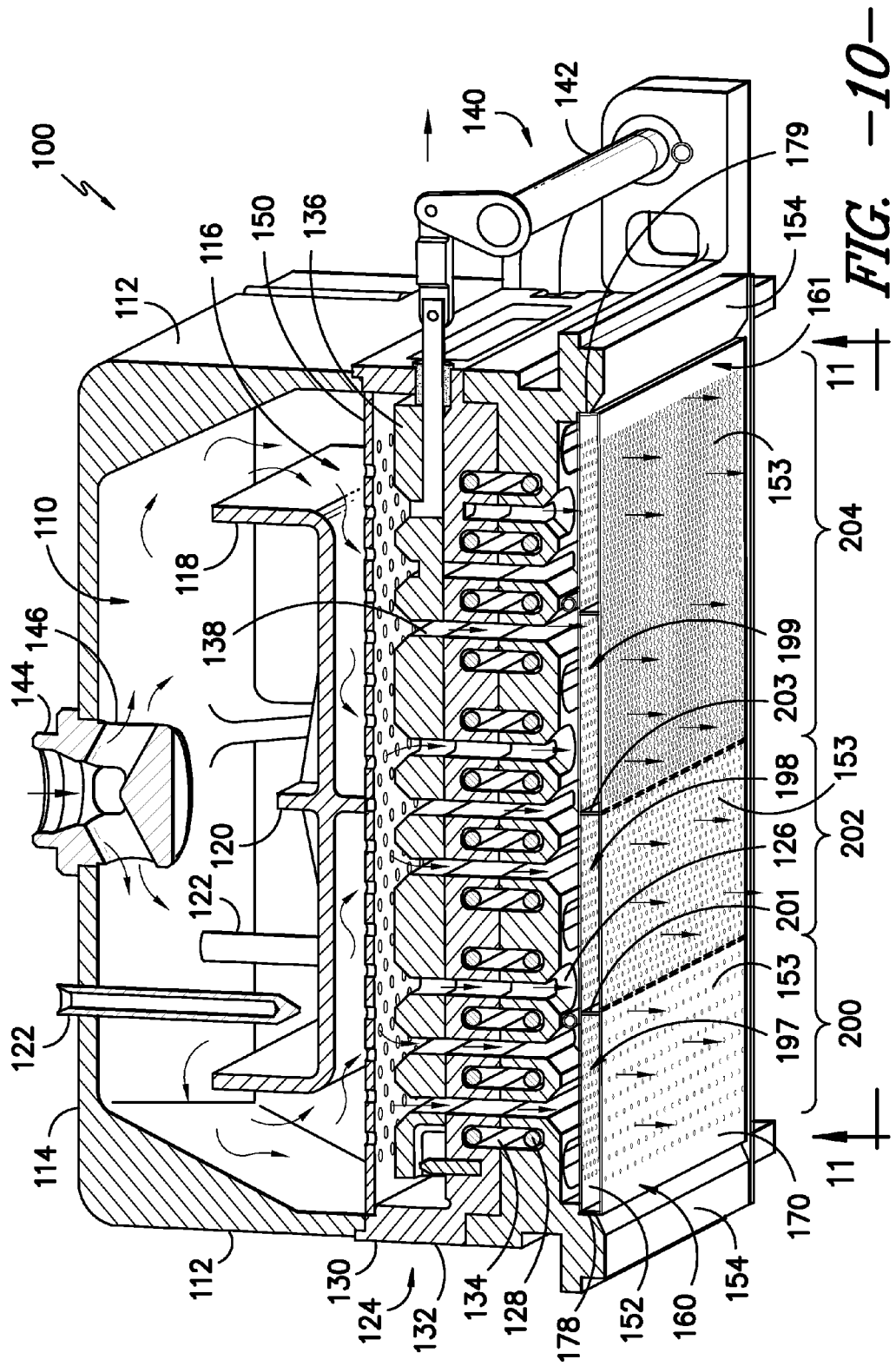
FIG. -10-

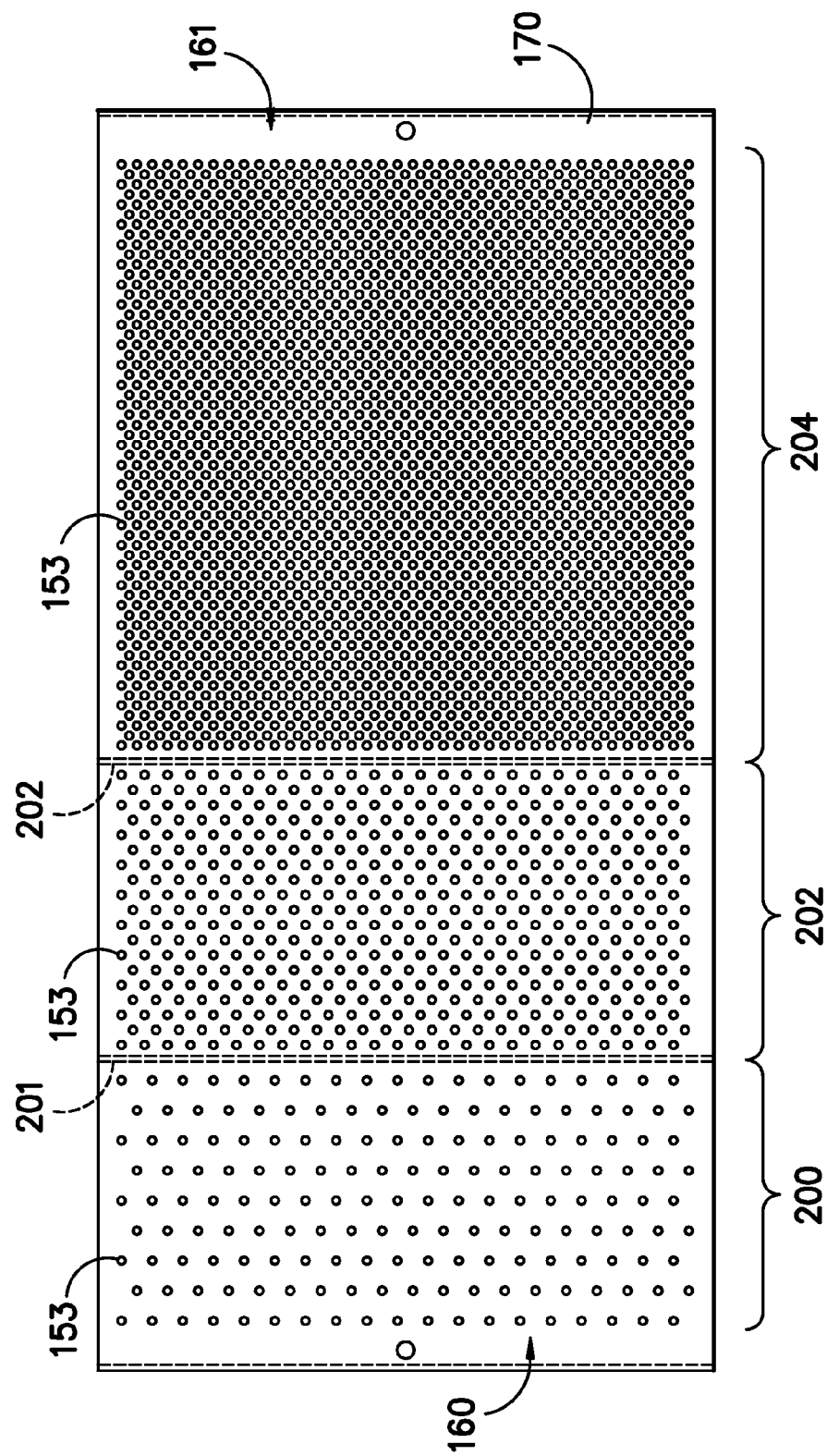
FIG. -11-

TEMPORALLY VARIABLE DEPOSITION RATE OF CDTE IN APPARATUS AND PROCESS FOR CONTINUOUS DEPOSITION

FIELD OF THE INVENTION

The subject matter disclosed herein relates generally to the field of thin film deposition processes wherein a thin film layer, such as a semiconductor material layer, is deposited on a substrate. More particularly, the subject matter is related to a vapor deposition apparatus and associated process for depositing a thin film layer of a photo-reactive material (e.g., CdTe) on a glass substrate in the formation of photovoltaic (PV) modules.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Closed System Sublimation) is a known commercial vapor deposition process for production of CdTe modules. Reference is made, for example, to U.S. Pat. No. 6,444,043 and U.S. Pat. No. 6,423,565. Within the vapor deposition chamber in a CSS system, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimated material moves through holes in a cover placed over the receptacle and deposits onto the stationary glass surface, which is held at the smallest possible distance (1-2 mm) above the cover frame.

A constant supply of CdTe vapors through the hole plate creates a uniform vapor pressure for deposition onto the substrate. Thus, the deposition rate for the entire CdTe layer can be substantially constant, in an effort to ensure that a substantially uniform thin film layer is formed on the substrate. However, if the initial deposition rate it too fast, voids (i.e., small areas free from CdTe) can be created during the initial deposition. These voids can be exaggerated as the deposition process continues.

Accordingly, there exists an ongoing need in the industry for an improved vapor deposition apparatus and process for economically feasible large scale production of efficient PV modules, particularly CdTe modules. In particular, a need exists for an improved sublimation plate for use in an economically feasible large scale production of efficient PV modules, particularly CdTe modules, in a CSS process.

BRIEF DESCRIPTION OF THE INVENTION

Aspects and advantages of the invention will be set forth in part in the following description, or may be obvious from the description, or may be learned through practice of the invention.

In one embodiment, an apparatus is generally provided for vapor deposition of a sublimated source material as a thin film on a photovoltaic module substrate. The apparatus includes a receptacle disposed in a deposition head and configured for receipt of a granular source material. A heated distribution manifold is disposed below the receptacle and configured to heat said receptacle to a degree sufficient to sublimate source material within the receptacle. A distribution plate is disposed below the distribution manifold and at a defined distance above a horizontal conveyance plane of an upper surface of a substrate conveyed through the apparatus. The distribution plate defines a pattern of passages therethrough configured to create a pressure gradient in the longitudinal direction from a first longitudinal end to a second longitudinal end.

The apparatus can have, in one embodiment, a first distribution plate and a second deposition plate. The first deposition plate can be disposed below said distribution manifold and defining a first pattern of passages therethrough. The second distribution plate can be disposed below the first distribution plate and at a defined distance above a horizontal conveyance plane of an upper surface of a substrate conveyed through said apparatus. The second distribution plate defines a second pattern of passages therethrough configured to provide greater resistance to the flow of sublimated source vapors at a first longitudinal end than a second longitudinal end.

A process is also generally provided for vapor deposition of a sublimated source material to form thin film on a photovoltaic module substrate. A source material is supplied to a receptacle within a deposition head. The receptacle can then be heated with a heat source member to sublimate the source material. Individual substrates can be conveyed through the deposition head, and the sublimated source material can be distributed onto an upper surface of the substrates via a distribution plate positioned between the upper surface of the substrate and the receptacle. The distribution plate defines a pattern of passages therethrough that provides greater resistance to the flow of sublimated source vapors at a first longitudinal end than a second longitudinal end.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 is a plan view of a system that may incorporate embodiments of a vapor deposition apparatus of the present invention;

FIG. 2 is a cross-sectional view of an embodiment of a vapor deposition apparatus according to aspects of the invention in a first operational configuration;

FIG. 3 is a cross-sectional view of the embodiment of FIG. 2 in a second operational configuration;

FIG. 4 is a cross-sectional view of the embodiment of FIG. 2 in cooperation with a substrate conveyor;

FIG. 5 is a top view of the receptacle component within the embodiment of FIG. 2;

FIG. 6 is a cross-sectional view of another embodiment of a vapor deposition apparatus according to aspects of the invention in a first operational configuration;

FIG. 7 is a cross-sectional view of yet another embodiment of a vapor deposition apparatus according to aspects of the invention in a first operational configuration FIG. 8 shows an embodiment of an alternative vapor deposition apparatus having a plurality diffusion compartments between the distribution plate and a second hole plate;

FIG. 9 shows a bottom view of the second hole plate of FIG. 8;

FIG. 10 shows another embodiment of an alternative vapor deposition apparatus having a plurality diffusion compartments between the distribution plate and a second hole plate; and, FIG. 11 shows a bottom view of the second hole plate of FIG. 10.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

FIG. 1 illustrates an embodiment of a system 10 that may incorporate a vapor deposition apparatus 100 (FIGS. 2 through 5) in accordance with embodiments of the invention configured for deposition of a thin film layer on a photovoltaic (PV) substrate 14 (referred to hereafter as a "substrate"). The thin film may be, for example, a film layer of cadmium telluride (CdTe). As mentioned, it is generally recognized in the art that a "thin" film layer on a PV module substrate is generally less than about 10 microns (μm).

The vapor deposition apparatus 100 includes a distribution plate 152 disposed below the distribution manifold 124 at a defined distance above a horizontal plane of the upper surface of an underlying substrate 14, as depicted in FIG. 4. The distribution plate 152 defines a pattern of passages, such as holes, slits, and the like, therethrough that further distribute the sublimated source material passing through the distribution manifold 124 such that the source material vapors are uninterrupted in the transverse direction T. In other words, the pattern of passages are shaped and staggered or otherwise positioned to ensure that the sublimated source material is deposited completely over the substrate in the transverse direction so that longitudinal streaks or stripes of "un-coated" regions on the substrate are avoided.

The pattern of passages in the distribution plate 152 can be configured to provide greater resistance for the flow of source vapors therethrough at the first longitudinal end 160 than the second longitudinal end 161 of the distribution plate 152. This greater resistance at the first longitudinal end 160 can provide for an initial deposition rate of the CdTe layer on the substrate 14 (as the substrate 14 passes under the first longitudinal end 160 of distribution plate 152) that is less than (i.e., slower than) the final deposition rate (as the substrate 14 passes under the second longitudinal end 161 of distribution plate 152) where there is less resistance to the passage of the source vapors. Through these resistance differences, a pressure gradient in the longitudinal direction may be formed within the apparatus between the distribution plate 152 and the underlying substrates 14. For instance, the vapor pressure of the source material (i.e., the CdTe material) along the first longitudinal end 160 of the distribution plate 152 may be lower than the vapor pressure of the source material along the second longitudinal end 161.

Accordingly, the foundation of the CdTe layer can be formed at an initial deposition rate that is relatively slow to prevent the formation of voids along the heterojunction surface of the CdTe layer. For example, the initial deposition rate of the CdTe layer on the substrate 14, as the substrate 14 passes under the first longitudinal end 160 of distribution plate 152, can be about 0.5 μm/minute to about 20 μm/minute (e.g., about 1 μm/minute to about 5 μm/minute). Conversely, the final deposition rate of the CdTe layer on the substrate 14, as the substrate 14 passes under the second longitudinal end 161 of distribution plate 152, can be about 5 μm/minute to about 100 μm/minute (e.g., about 20 μm/minute to about 75 μm/minute).

In particular embodiments, the average deposition rate of the entire CdTe layer can be about 5 μm/minute to about 50 μm/minute forming a CdTe layer having a thickness of about 1 μm to about 5 μm (e.g., about 2 μm to about 4 μm).

In the embodiment shown in FIGS. 2 and 3, the distribution plate 152 defines a pattern of passages 153 having an increasing average area (e.g., the diameter if the passages 153 are circular holes) in the longitudinal direction parallel to the direction of travel of the substrates 14. For instance, the average area of the passages along the first longitudinal end 160 of the distribution plate 152 are smaller than the average area of the passages along the second longitudinal end 161 of the distribution plate 152. Thus, the source vapors (i.e., CdTe vapors) can more freely pass through the distribution plate 152 at the second longitudinal end 161 than the first longitudinal end 160, resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

In the embodiment shown in FIGS. 2-3, the average areas of the passages 153 increase gradually through the longitudinal direction from the first longitudinal end 160 to the second longitudinal end 161. The increase in average areas of the passages 153 can be substantially linear increase; however, the pattern can have an increase in average area of the passages in any suitable manner.

For example, the average areas of the passages can increase step-wise through a plurality of sections forming a sectional distribution plate 152. Referring to the embodiment of FIG. 6, the pattern of passages in the distribution plate 152 defines a first section 162, a second section 164, and a third section 166. The first section 162 is located near (e.g. adjacent to) the first longitudinal end 160, and the third section 166 is located near (e.g. adjacent to) the second longitudinal end 161. The second section 164 is located between the first section 162 and the third section 166. Of course, more than three sections can be included in the distribution plate as desired.

The first section 162 contains a plurality of first passages 163; the second section 164 contains a plurality of second passages 165; and third section 166 contains a plurality of third passages 167. The first passages 163 have a relatively small average area such that the average area of the second passages 165 is larger than the average area of the first passages 163. Similarly, the third passages 167 have an average area larger than the average area of the second passages 165. For example, the average area of the second passages 165 can be about 1.1 to about 2.5 times larger than the average area of the first passages 163 (i.e., the average area of the second passages 165 is about 110% to about 250% of the average area of the first passages 163). For instance, the average area of the second passages 165 can be about 1.5 to about 2 times larger than the average area of the first passages 163 (i.e., the average area of the second passages 165 is about 150% to about 200% of the average area of the first passages 163). In turn, the average area of the third passages 167 can be about 1.1 to about 2.5 times larger than the average area of the second passages 165 (i.e., the average area of the third passages 167 is about 110% to about 250% of the average area of the second passages 165). For instance, the average area of the third passages 167 can be about 1.5 to about 2 times larger than the average area of the second passages 165 (i.e., the average area of the third passages 167 is about 150% to about 200% of the average area of the second passages 165).

Thus, the source vapors (i.e., CdTe vapors) can more freely pass through the distribution plate 152 at the second longitudinal end 161 (i.e., through the third section 166) than the first longitudinal end 160 (i.e., through the first section 162), resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

FIG. 7 shows yet another pattern of passages 153 defined in the distribution plate 152 such that the vapor pressure of the source material (i.e., the CdTe material) along the first longitudinal end 160 of the distribution plate 152 is lower than the vapor pressure of the source material along the second longitudinal end 161. In the embodiment shown in FIG. 7, the distribution plate 152 defines a pattern of passages 153 having an increasing passage density in the longitudinal direction parallel to the direction of travel of the substrates 14. For example, the first passage density near the first longitudinal end 160 is less than the second passage density near the second longitudinal end 161. Thus, the source vapors (i.e., CdTe vapors) can more freely pass through the distribution plate 152 at the second longitudinal end 161 than the first longitudinal end 160, resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

In the embodiment shown in FIG. 7, the pattern density of the passages 153 increases gradually through the longitudinal direction from the first longitudinal end 160 to the second longitudinal end 161. The increase in pattern density of the passages 153 can be a substantially linear increase; however, the pattern can have an increase in pattern density of the passages in any suitable manner, including step-wise increases utilizing sections as shown in FIG. 6.

In the embodiment of FIG. 7, the passages 153 can have substantially the same average area throughout the distribution plate 152, as shown. Alternatively, the average area can increase in the longitudinal direction (along with the increasing passage density), as shown in FIGS. 2-6.

FIG. 8 shows an embodiment of an alternative vapor deposition apparatus having a plurality diffusion compartments between the distribution plate 152 and a second distribution plate 170. The second distribution plate 170 is generally configured to control the diffusion rate of the source vapors (i.e., CdTe vapors) to the substrates 14 passing underneath. In particular, the source vapors can more freely pass through the second distribution plate 170 at the second longitudinal end 161 than the first longitudinal end 160, resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

In the embodiment of FIG. 8, the source vapors flow through the distribution plate 152 into the plurality of diffusion compartments 171, 173, 175, and 177. Each diffusion compartment 171, 173, 175, and 177 respectively corresponds to a longitudinal section 180, 182, 184, and 186 in the second distribution plate 170. The combination of the diffusion compartments 171, 173, 175, and 177 and their respective longitudinal sections 180, 182, 184, and 186 allows for the diffusion rate through the second distribution plate 170 to increase step-wise in the longitudinal direction from the first longitudinal end 160 to the second longitudinal end 161. Thus, the source vapors (i.e., CdTe vapors) can more freely pass through the second distribution plate 170 at the second longitudinal end 161 than the first longitudinal end 160, resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

For example, referring to the second distribution plate 170 shown in FIG. 9, the average areas of the passages can increase step-wise through the longitudinal sections 180, 182, 184, and 186 in the second distribution plate 170. Referring to the embodiment of FIG. 8, the pattern of passages in the second distribution plate 170 defines a first section 180, a second section 182, a third section 184, and a forth section 186. The first section 180 is located near (e.g. adjacent to) the first longitudinal end 160, and the fourth section 186 is located near (e.g. adjacent to) the second longitudinal end 161. The second section 182 and the third section 184 are located between the first section 180 and the fourth section 186. Of course, two, three or more than four sections can be included in the distribution plate as desired.

The first section 180 contains a plurality of first passages 181 that have a relatively small average area such that the average area of the second passages 183 of the second section 182 is larger than the average area of the first passages 181. Similarly, the third passages 185 have an average area larger than the average area of the second passages 183. In turn, the fourth passages 187 of the fourth section 186 have an average area larger than the average area of the third passages 185.

For example, the average area of the second passages 183 can be about 1.1 to about 2.5 times larger than the average area of the first passages 181 (i.e., the average area of the second passages 183 is about 110% to about 250% of the average area of the first passages 181). For instance, the average area of the second passages 183 can be about 1.5 to about 2 times larger than the average area of the first passages 181 (i.e., the average area of the second passages 165 is about 150% to about 200% of the average area of the first passages 163). In turn, the average area of the third passages 185 can be about 1.1 to about 2.5 times larger than the average area of the second passages 183 (i.e., the average area of the third passages 185 is about 110% to about 250% of the average area of the second passages 183). For instance, the average area of the third passages 185 can be about 1.5 to about 2 times larger than the average area of the second passages 183 (i.e., the average area of the third passages 185 is about 150% to about 200% of the average area of the second passages 183). The average area of the fourth passages 187 can be about 1.1 to about 2.5 times larger than the average area of the third passages 185 (i.e., the average area of the fourth passages 187 is about 110% to about 250% of the average area of the third passages 185). For instance, the average area of the fourth passages 187 can be about 1.5 to about 2 times larger than the average area of the third passages 185 (i.e., the average area of the fourth passages 187 is about 150% to about 200% of the average area of the third passages 185).

The diffusion compartment 171, 173, 175, and 177 are shown separated respectively by internal walls 172, 174, and 176 extending in a traverse direction substantially perpendicular to the longitudinal direction. A first end wall 178 closes the first diffusion compartment 171 at the first longitudinal end 160, and a second end wall 179 closes the fourth diffusion compartment 177 at the second longitudinal end 161.

The diffusion compartments can be used below a first distribution plate 152 that has substantially uniform passage distribution and size. As such, the source vapors can pass through the first distribution plate 152 into the diffusion compartment 171, 173, 175, and 177 in a substantially uniform manner. However, due to the patterns of passages in the longitudinal sections 180, 182, 184, and 186 in the second distribution plate 170, each of the diffusion compartment 171, 173, 175, and 177 can have a decreasing vapor pressure since the source vapors can freely flow through the fourth section 186 adjacent to the second longitudinal end 161 more freely than the first section 180 adjacent to the first longitudinal end 160.

FIGS. 10 and 11 show another embodiment of an alternative vapor deposition apparatus having a plurality diffusion compartments between the distribution plate 152 and a second distribution plate 170 generally configured to control the diffusion rate of the source vapors (i.e., CdTe vapors) to the substrates 14 passing underneath. In particular, the source vapors can more freely pass through the second distribution plate 170 at the second longitudinal end 161 than the first longitudinal end 160, resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

In the embodiment of FIG. 10, the source vapors flow through the distribution plate 152 into the plurality of diffusion compartments 197, 198, and 199. Each diffusion compartment 197, 198, and 199 respectively corresponds to a longitudinal section 200, 202, and 204 in the second distribution plate 170. The combination of the diffusion compartments 197, 198, and 199 and their respective longitudinal sections 200, 202, and 204 allows for the diffusion rate through the second distribution plate 170 to increase step-wise in the longitudinal direction from the first longitudinal end 160 to the second longitudinal end 161. Thus, the source vapors (i.e., CdTe vapors) can more freely pass through the second distribution plate 170 at the second longitudinal end 161 than the first longitudinal end 160, resulting in a higher vapor pressure of CdTe vapors at the second longitudinal end 161 than the first longitudinal end 160. As such, the deposition rate of the CdTe layer is slower at the first longitudinal end 160 relative to a faster deposition rate at the second deposition rate at the second longitudinal end 161.

For example, referring to the second distribution plate 170 shown in FIG. 11, the density of the passages can increase step-wise through the longitudinal sections 200, 202, and 204 in the second distribution plate 170. Referring to the embodiment of FIG. 10, the pattern of passages in the second distribution plate 170 defines a first section 200, a second section 202, and a third section 204 separated by internal walls 201 and 203, respectively.

During use, the distribution plate 152 (and second distribution plate 170, if present) is heated to a temperature above the temperature of the substrate 14 to ensure that no material deposits and builds up on the distribution plate 152. For example, when depositing a thin film cadmium telluride layer, the substrate 14 may be heated to a substrate temperature between about 550° C. and about 700° C. (e.g., between about 600° C. and about 650° C.) while the distribution plate may be heated to a plate temperature above about 725° C., such as from about 750° C. to about 900° C. (e.g., from about 800° C. to about 850° C.).

It should be appreciated that the present vapor deposition apparatus 100 is not limited to use in the system 10 illustrated in FIG. 1, but may be incorporated into any suitable processing line configured for vapor deposition of a thin film layer onto a PV module substrate 14. For reference and an understanding of an environment in which the vapor deposition apparatus 100 may be used, the system 10 of FIG. 1 is described below, followed by a detailed description of the apparatus 100.

Referring to FIG. 1, the exemplary system 10 includes a vacuum chamber 12 defined by a plurality of interconnected modules, including a plurality of heater modules 16 that define a pre-heat section of the vacuum chamber 12 through which the substrates 14 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 100. The cool-down modules 20 define a cool-down section within the vacuum chamber 12 through which the substrates 14 having the thin film of sublimated source material deposited thereon are conveyed and cooled at a controlled cool-down rate prior to the substrates 14 being removed from the system 10. Each of the modules 20 may include a forced cooling system wherein a cooling medium, such as chilled water, refrigerant, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. As the leading section of a substrate 14 is conveyed out of the vapor deposition apparatus 100, it moves into the post-heat module 22, which maintains the temperature of the substrate 14 at essentially the same temperature as the trailing portion of the substrate still within the vapor deposition apparatus 100. In this way, the leading section of the substrate 14 is not allowed to cool while the trailing section is still within the vapor deposition apparatus 100. If the leading section of a substrate 14 were allowed to cool as it exited the apparatus 100, a non-uniform temperature profile would be generated longitudinally along the substrate 14. This condition could result in the substrate breaking from thermal stress.

As diagrammatically illustrated in FIG. 1, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 14 through the apparatus 100.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to draw an initial vacuum, and a "fine" (i.e., final) vacuum pump 38 is configured with the buffer module 30 to increase the vacuum in the buffer module 30 to essentially the vacuum pressure within the vacuum chamber 12. Slide gates or valves 34 are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

In operation of the system 10, an operational vacuum is maintained in the vacuum chamber 12 by way of any combination of rough and/or fine vacuum pumps 40. In order to introduce a substrate 14 into the vacuum chamber 12, the load module 28 and buffer module 30 are initially vented (with the slide valve 34 between the two modules in the open position). The slide valve 34 between the buffer module 30 and the first heater module 16 is closed. The slide valve 34 between the load module 28 and load conveyor 26 is opened and a substrate 14 is moved into the load module 28. At this point, the first slide valve 34 is shut and the rough vacuum pump 32 then draws an initial vacuum in the load module 28 and buffer module 30. The substrate 14 is then conveyed into the buffer module 30, and the slide valve 34 between the load module 28 and buffer module 30 is closed. The fine vacuum pump 38 then increases the vacuum in the buffer module 30 to approximately the same vacuum in the vacuum chamber 12. At this point, the slide valve 34 between the buffer module 30 and vacuum chamber 12 is opened and the substrate 14 is conveyed into the first heater module 16.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and slide valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

FIGS. 2 through 5 relate to a particular embodiment of the vapor deposition apparatus 100. Referring to FIGS. 2 and 3 in particular, the apparatus 100 includes a deposition head 110 defining an interior space in which a receptacle 116 is configured for receipt of a granular source material (not shown). As mentioned, the granular source material may be supplied by a feed device or system 24 (FIG. 1) via a feed tube 148 (FIG. 4). The feed tube 148 is connected to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes longitudinal end walls 112 and side walls 113 (FIG. 5). Referring to FIG. 5 in particular, the receptacle 116 has a shape and configuration such that the end walls 118 are spaced from the end walls 112 of the head chamber 110. The side walls 117 of the receptacle 116 lie adjacent to and in close proximity to the side walls 113 of the deposition head so that very little clearance exists between the respective walls, as depicted in FIG. 5. With this configuration, sublimated source material will flow out of the open top of the receptacle 116 and downwardly over the end walls 118 as leading and trailing curtains of vapor 119 over, as depicted in FIGS. 2, 3, and 5. Very little of the sublimated source material will flow over the side walls 117 of the receptacle 116.

A heated distribution manifold 124 is disposed below the receptacle 116. This distribution manifold 124 may take on various configurations within the scope and spirit of the invention, and serves to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIGS. 2 and 3. Heater elements 128 are disposed within the cavities 134 and serve to heat the distribution manifold 124 to a degree sufficient for indirectly heating the source material within the receptacle 116 to cause sublimation of the source material. The heater elements 128 may be made of a material that reacts with the source material vapor and, in this regard, the shell members 130, 132 also serve to isolate the heater elements 128 from contact with the source material vapor. The heat generated by the distribution manifold 124 is also sufficient to prevent the sublimated source material from plating out onto components of the head chamber 110. Desirably, the coolest component in the head chamber 110 is the upper surface of the substrates 14 conveyed therethrough so as to ensure that the sublimated source material plates onto the substrate, and not onto components of the head chamber 110.

Still referring to FIGS. 2 and 3, the heated distribution manifold 124 includes a plurality of passages 126 defined therethrough. These passages have a shape and configuration so as to uniformly distribute the sublimated source material towards the underlying substrates 14 (FIG. 4).

In the illustrated embodiment, the distribution plate 152 is disposed below the distribution manifold 124 at a defined distance above a horizontal plane of the upper surface of an underlying substrate 14, as depicted in FIG. 4. This distance may be, for example, between about 0.3 cm to about 4.0 cm. In a particular embodiment, the distance is about 1.0 cm. The conveyance rate of the substrates below the distribution plate 152 may be in the range of, for example, about 10 mm/sec to about 40 mm/sec. In a particular embodiment, this rate may be, for example, about 20 mm/sec. The thickness of the CdTe film layer that plates onto the upper surface of the substrate 14 can vary within the scope and spirit of the invention, and may be, for example, between about 1 micron to about 5 microns. In a particular embodiment, the film thickness may be about 3 microns.

As previously mentioned, a significant portion of the sublimated source material will flow out of the receptacle 116 as leading and trailing curtains of vapor 119, as depicted in FIG. 5. Although these curtains of vapor 119 will diffuse to some extent in the longitudinal direction prior to passing through the distribution plate 152, it should be appreciated that it is unlikely that a uniform distribution of the sublimated source material in the longitudinal direction will be achieved. In other words, more of the sublimated source material will be distributed through the longitudinal end sections of the distribution plate 152 as compared to the middle portion of the distribution plate. However, as discussed above, because the system 10 conveys the substrates 14 through the vapor deposition apparatus 100 at a constant (non-stop) linear speed, the upper surfaces of the substrates 14 will be exposed to the same deposition environment regardless of any non-uniformity of the vapor distribution along the longitudinal aspect of the apparatus 100. The passages 126 in the distribution manifold 124 and the holes in the distribution plate 152 ensure a relatively uniform distribution of the sublimated source material in the transverse aspect of the vapor deposition apparatus 100. So long as the uniform transverse aspect of the vapor is maintained, a relatively uniform thin film layer is deposited onto the upper surface of the substrates 14 regardless of any non-uniformity in the vapor deposition along the longitudinal aspect of the apparatus 100.

As illustrated in the figures, it may be desired to include a debris shield 150 between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the distribution manifold 124, as discussed in greater detail below. In other words, the debris shield 150 can be configured to act as a breathable screen that inhibits the passage of particles without substantially interfering with vapors 119 flowing through the shield 150.

Referring to FIGS. 2 through 4 in particular, apparatus 100 desirably includes transversely extending seals 154 at each longitudinal end of the head chamber 110. In the illustrated embodiment, the seals define an entry slot 156 and an exit slot 158 at the longitudinal ends of the head chamber 110. These seals 154 are disposed at a distance above the upper surface of the substrates 14 that is less than the distance between the surface of the substrates 14 and the distribution plate 152, as is depicted in FIG. 4. The seals 154 help to maintain the sublimated source material in the deposition area above the substrates. In other words, the seals 154 prevent the sublimated source material from "leaking out" through the longitudinal ends of the apparatus 100. It should be appreciated that the seals 154 may be defined by any suitable structure. In the illustrated embodiment, the seals 154 are actually defined by components of the lower shell member 132 of the heated distribution manifold 124. It should also be appreciated that the seals 154 may cooperate with other structure of the vapor deposition apparatus 100 to provide the sealing function. For example, the seals may engage against structure of the underlying conveyor assembly in the deposition area.

Any manner of longitudinally extending seal structure 155 may also be configured with the apparatus 100 to provide a seal along the longitudinal sides thereof. Referring to FIGS. 2 and 3, this seal structure 155 may include a longitudinally extending side member that is disposed generally as close as reasonably possible to the upper surface of the underlying convey surface so as to inhibit outward flow of the sublimated source material without frictionally engaging against the conveyor.

Referring to FIGS. 2 and 3, the illustrated embodiment includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 3. As can be readily appreciated from FIG. 3, in this operational position of the shutter plate 136, the sublimated source material is free to flow through the shutter plate 136 and through the passages 126 in the distribution manifold 124 for subsequent distribution through the plate 152. Referring to FIG. 2, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the head chamber 110.

The shutter plate 136 configuration illustrated in FIGS. 2 and 3 is particularly beneficial in that, as desired, the sublimated source material can be quickly and easily contained within the head chamber 110 and prevented from passing through to the deposition area above the conveying unit. This may be desired, for example, during start up of the system 10 while the concentration of vapors 119 within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

Referring to FIG. 4, the vapor deposition apparatus 100 may further comprise a conveyor 190 disposed below the head chamber 110. This conveyor 190 may be uniquely configured for the deposition process as compared to the conveyors 48 discussed above with respect to the system 10 of FIG. 1. For example, the conveyor 190 may be a self-contained conveying unit that includes a continuous loop conveyor on which the substrates 14 are supported below the distribution plate 152. In the illustrated embodiment, the conveyor 190 is defined by a plurality of slats 192 that provide a flat, unbroken (i.e., no gaps between the slats) support surface for the substrates 14. The slat conveyor is driven in an endless loop around sprockets 194. It should be appreciated, however, that the invention is not limited to any particular type of conveyor 190 for moving the substrates 14 through the vapor deposition apparatus 100.

The present invention also encompasses various process embodiments for vapor deposition of a sublimated source material to form a thin film on a PV module substrate. The various processes may be practiced with the system embodiments described above or by any other configuration of suitable system components. It should thus be appreciated that the process embodiments according to the invention are not limited to the system configuration described herein.

In a particular embodiment, the vapor deposition process includes supplying source material to a receptacle within a deposition head, and indirectly heating the receptacle with a heat source member to sublimate the source material. The sublimated source material is directed out of the receptacle and downwardly within the deposition head through the heat source member. Individual substrates are conveyed below the heat source member. The sublimated source material that passes through the heat source is distributed onto an upper surface of the substrates such that leading and trailing sections of the substrates in the direction of conveyance thereof are exposed to the same vapor deposition conditions so as to achieve a desired uniform thickness of the thin film layer on the upper surface of the substrates.

In a unique process embodiment, the sublimated source material is directed from the receptacle primarily as transversely extending leading and trailing curtains relative to the conveyance direction of the substrates. The curtains of sublimated source material are directed downwardly through the heat source member towards the upper surface of the substrates. These leading and trailing curtains of sublimated source material may be longitudinally distributed to some extent relative to the conveyance direction of the substrates after passing through the heat source member.

In yet another unique process embodiment, the passages for the sublimated source material through the heat source may be blocked with an externally actuated blocking mechanism, as discussed above.

Desirably, the process embodiments include continuously conveying the substrates at a substantially constant linear speed during the vapor deposition process.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An apparatus for vapor deposition of a sublimated source material as a thin film on a photovoltaic module substrate, said apparatus comprising:
   a deposition head;
   a receptacle disposed in said deposition head, said receptacle configured for receipt of a granular source material;
   a heated distribution manifold disposed below said receptacle, said heated distribution manifold configured to heat said receptacle to a degree sufficient to sublimate source material within said receptacle; and, a distribution plate disposed below said distribution manifold and at a defined distance above a horizontal conveyance plane of an upper surface of a substrate conveyed through said apparatus, said distribution plate defining a pattern of passages therethrough, and wherein the pattern of passages is configured to provide greater resistance to the flow of sublimated source vapors at a first longitudinal end where the substrate enters the apparatus than at a second longitudinal end where the substrate exits the apparatus.

2. The apparatus as in claim 1, wherein the passages have an increasing average area in a longitudinal direction parallel to a direction of travel of the substrates such that the average area of the passages along the first longitudinal end of the distribution plate is smaller than the average area of the passages along the second longitudinal end of the distribution plate.

3. The apparatus as in claim 2, wherein the increase in average areas of the passages is a substantially linear increase.

4. The apparatus as in claim 1, wherein the passages have an increasing average area in a step-wise pattern through a plurality of sections forming a sectional distribution plate such that the average area of the passages along the first longitudinal end of the distribution plate is smaller than the average area of the passages along the second longitudinal end of the distribution plate.

5. The apparatus as in claim 4, wherein the pattern of passages defines a first section of first passages, a second section of second passages, and a third section of third passages, wherein the first section is adjacent to the first longitudinal end, the second section is positioned between the first and third sections, and the third section is adjacent to the second longitudinal end, and wherein second passages have an average area that is larger than an average area of the first passages and the third passages have an average area that is larger than an average area of the second passages.

6. The apparatus as in claim 5, wherein the average area of the second passages is about 1.1 to about 2.5 times larger than the average area of the first passages, and wherein the average area of the third passages is about 1.1 to about 2.5 times larger than the average area of the second passages.

7. The apparatus as in claim 1, wherein the pattern of passages has an increasing passage density in the longitudinal direction parallel to the direction of travel of the substrates such that a first passage density adjacent to the first longitudinal end is less than a second passage density adjacent to the second longitudinal end.

8. The apparatus as in claim 7, wherein the passages have substantially the same average area throughout the distribution plate.

9. The apparatus as in claim 7, wherein the pattern of passages has an increasing passage density in the longitudinal direction parallel to the direction of travel of the substrates in a step-wise pattern through the plurality of sections such that a first passage density adjacent to the first longitudinal end is less than a second passage density adjacent to the second longitudinal end.

10. The apparatus as in claim 7, wherein the increase in pattern density of the passages is a substantially linear increase.

11. An apparatus for vapor deposition of a sublimated source material as a thin film on a photovoltaic module substrate, said apparatus comprising:

a deposition head;

a receptacle disposed in said deposition head, said receptacle configured for receipt of a granular source material;

a heated distribution manifold disposed below said receptacle, said heated distribution manifold configured to heat said receptacle to a degree sufficient to sublimate source material within said receptacle;

a first distribution plate disposed below said distribution manifold, wherein the first distribution plate defines a first pattern of passages therethrough; and, a second distribution plate disposed below the first distribution plate and at a defined distance above a horizontal conveyance plane of an upper surface of a substrate conveyed through said apparatus, said second distribution plate defining a second pattern of passages therethrough, and wherein the pattern of passages is configured to provide greater resistance to the flow of sublimated source vapors at a first longitudinal end where the substrate enters the apparatus than at a second longitudinal end where the substrate exits the apparatus.

12. The apparatus as in claim 11, further comprising:

a plurality of diffusion compartments between the first distribution plate and the second distribution plate corresponding to a plurality of sections defined in the second distribution plate.

13. The apparatus as in claim 12, wherein adjacent diffusion compartments are separated by an internal wall extending in a traverse direction substantially perpendicular to the longitudinal direction.

14. The apparatus as in claim 13, wherein the second pattern defines passages having an increasing average area in a step-wise pattern through the plurality of sections such that the average area of the passages along the first longitudinal end of the second distribution plate is smaller than the average area of the passages along the second longitudinal end of the second distribution plate.

15. The apparatus as in claim 13, wherein the second pattern has an increasing passage density in the longitudinal direction parallel to the direction of travel of the substrates in a step-wise pattern through the plurality of sections such that a first passage density adjacent to the first longitudinal end is less than a second passage density adjacent to the second longitudinal end.

* * * * *